Figure 1:
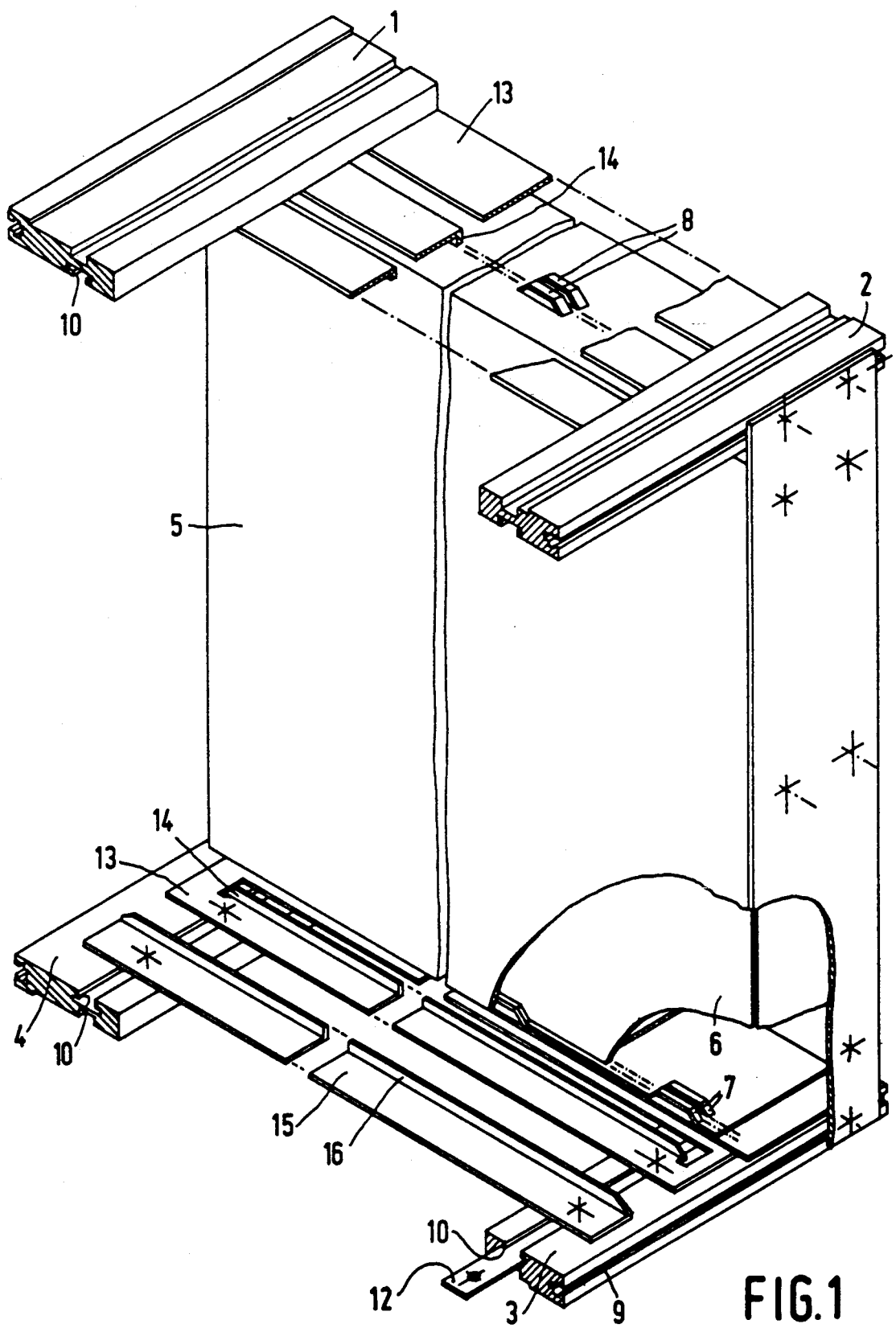

United States Patent [19]

Peyerl

[11] Patent Number: 5,008,778

[45] Date of Patent: Apr. 16, 1991

[54] ACCOMMODATION DEVICE WITH SHIELDED CIRCUIT BOARDS

[75] Inventor: Gerhard Peyerl, Nuremberg, Fed. Rep. of Germany

[73] Assignee: U.S. Philips Corporation, New York, N.Y.

[21] Appl. No.: 258,405

[22] Filed: Oct. 17, 1988

[30] Foreign Application Priority Data

Oct. 20, 1987 [DE] Fed. Rep. of Germany ....... 3735456

[51] Int. Cl.$^5$ .......................... H05K 7/14; H05K 7/18
[52] U.S. Cl. .................................... 361/415; 361/399; 361/424
[58] Field of Search ............... 361/391, 394, 395, 399, 361/424, 415; 174/35 R, 35 GC, 35 MS

[56] References Cited

U.S. PATENT DOCUMENTS

| | | | |
|---|---|---|---|
| 3,289,047 | 11/1966 | Pick | 361/415 |
| 3,878,438 | 4/1975 | Weisman | 361/415 |
| 4,386,388 | 5/1983 | Beun | 361/424 |
| 4,533,977 | 8/1985 | Koppensteiner et al. | 361/415 |

*Primary Examiner*—Leo P. Picard
*Assistant Examiner*—Paramita Ghosh

[57] ABSTRACT

An accommodation device for accommodating circuit boards on two opposite inner sides with guide grooves into which the edges of the circuit boards are inserted and for accommodating circuit boards in shielded housings which include grooves for receiving ridges on the accommodation device, the grooves and ridges acting as a guide for the shielded housings.

3 Claims, 2 Drawing Sheets

ACCOMMODATION DEVICE WITH SHIELDED CIRCUIT BOARDS

The invention relates to an accommodation device or framework for circuit boards in shielded housings, which have at two opposite side walls, grooves for the accommodation of, guide means co-on the accommodation device. Such shielded circuit boards are usually found in the electrical communicatio industry; the accommodation devices may be, for example, equipment housings or frames in which a large number of such shielded circuit boards can be accommodated.

It is known to provide devices for accommodating circuit boards with guide grooves on two opposite inner sides, into which grooves subassemblies in the form of assembled circuit boards can be inserted by their edges. The edges of the circuit boards in this case constitute guide means arranged on two opposite sides. It is further known to provide such circuit boards with metal shield hoods for shielding, one shield hood covering the soldering side and the other shield hood covering the side of the elements. The edges of the circuit board then remain free and can be used as guide means also in this shielded construction. The manufacture of two separate shield hoods and their attachments each time on a circuit board side is expensive, however.

It is further known from German Patent 2747894 to provide for improvement of the shielding by providing a closed housing made of metal, which has on opposite inner sides grooves, into which the circuit board can be inserted. Two opposite walls of the planar subassembly thus formed are provided externally with guide ridges, which are passed into correspondingly formed grooves in a frame work or in an accommodation frame. If in the same accommodation device both unshielded circuit boards and shielded planar subassemblies of the construction described above are used, it appears that in a uniform construction of the accommodation frame the circuit boards must have different dimensions dependent upon the fact whether they are or are not used in a shielded housing.

However, during the manufacture of circuit boards, given standard dimensions have been obtained, for example the so-called European standard size printed circuit boards. The distances between the circuit boards guide surfaces in the frameworks and accommodation frames are proportioned in accordance with these standardized dimensions. A reduction of the circuit board surface area available compared with the standard size is also undesirable because consequently the accommodation capacity of the circuit board is limited.

The invention has for its object to construct a device of the kind mentioned in the opening paragraph in such a manner that without modification of the dimensions of the frameworks or accommodation frames circuit boards of the size otherwise usual therefore can be provided in a closed shielded housing.

According to the invention, this object is achieved in that the guide means in the accommodation device are ridges and the guide means at the shielded housing are grooves. A further embodiment of the invention is characterized in that the shielded housing consist of sheet metal and the grooves are formed by depressions. A shielded housing thus constructed can be manufactured at very low cost because no separate parts are required for the grooves.

A further improvement consists in that the accommodation device comprises transverse carriers formed from sheet metal and having several parallel ridges, the ridges being strips of sheet metal freely stamped from the sheet metal surface and rectangularly bent.

In order that the invention may be readily carried out, it will now be described more fully with reference to an embodiment shown in FIGS. 1 to 3.

Figure 2:
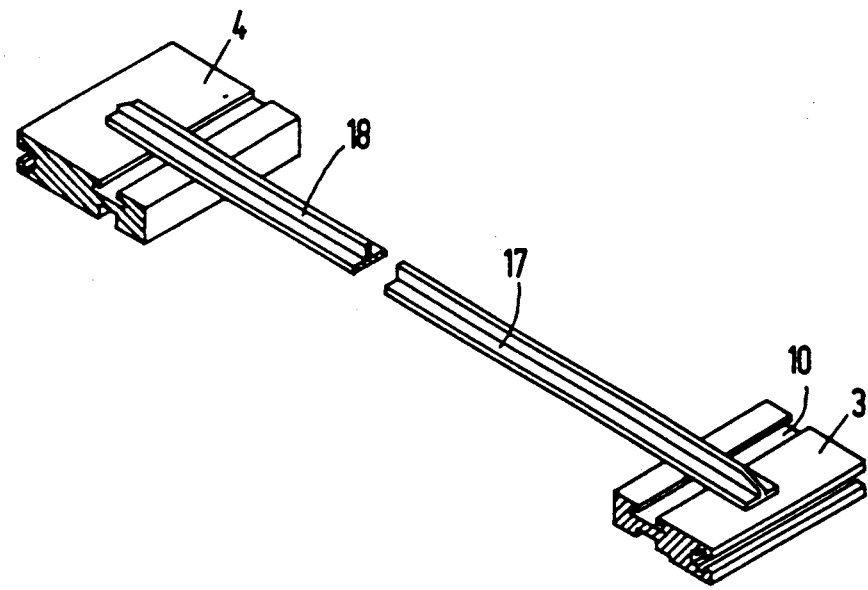
Figure 3:
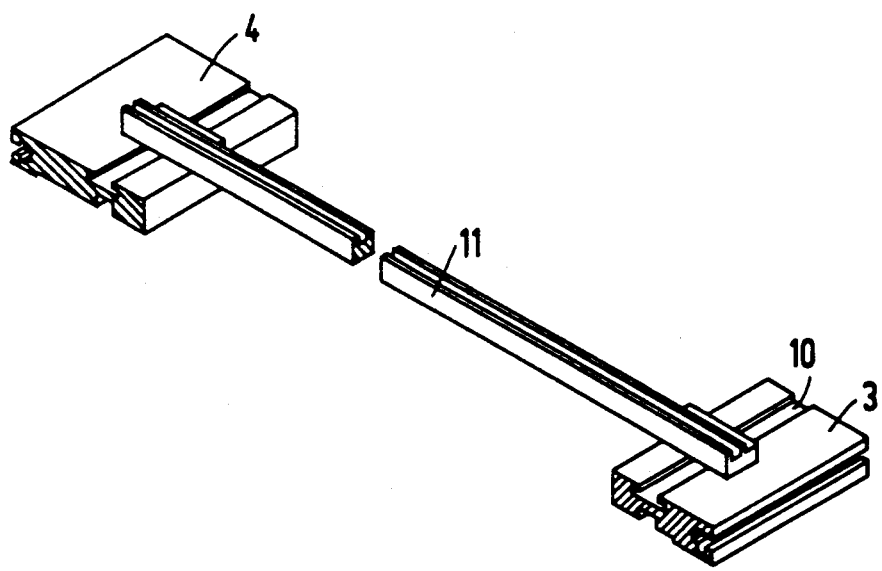

In the drawing:

FIG. 1 shows diagrammatically an oblique elevation of a section of an accommodation device with an inserted shielded circuit board, FIG. 2 shows diagrammatically a transverse carrier with a guide ridge, FIG. 3 shows diagrammatically a transverse carrier with a guide groove.

In the diagrammatic representation of FIG. 1 of a section of an accommodation device for circuit boards in shielded housings upper bars 1 and 2 and lower bars 3 and 4 are shown, of which the accommodation device is composed. The bars are secured in known manner laterally to a framework or in a housing. They are preferably in the form of extrusion profiles and carry T-shaped grooves (9, 10) both on the broad and on the narrow sides. Transverse carriers (13, 15) carrying guide means (14, 16) can be secured in the T-shaped grooves 10 extending along the broad sides of the bars 1 to 4 between two bars. In FIG. 1, two different embodiments of such transverse carriers are shown. In the first embodiment, a guide surface is provided, which consists of a transverse carrier 13 in the form of a flat piece of sheet metal, which can be screwed by means of screws to sheet metal strips 12 with threaded holes inserted into the T-shaped grooves. Instead of a sheet metal strip with threaded holes, individual sliding nuts may also be used. This transverse carrier 13 carries as guide means several parallel ridges 14, which can be manufactured in a simple manner by freely stamping of a sheet metal strip and bending this sheet metal strip from the surface of the transverse carrier metal sheet. This embodiment has the advantage that for securing a large number of bars only a few securing means are required, that further for mounting the bars particular jigs for maintaining defined relative distances of the guide means may be dispensed with and that nevertheless with the use of modern numerically controlled stamping machines transverse carriers, in which the bars have different relative distances, can be manufactured without the need of special tools.

Another embodiment of the transverse carriers exist in which a transverse carrier is a narrow sheet metal strip 15, one longitudinal side of which is rectangularly bent so that an elongate rectangularly bent metal sheet is formed, one limb of which constitutes the ridge 16 as guide means. This sheet metal strip 15 can also be screwed by means of screws to sheet metal strips 12 with threaded holes (threaded rails) or with individual sliding nuts guided in T-shaped grooves. This embodiment can also be manufactured in a very simple manner and at low cost.

A further advantageous embodiment of a transverse carrier with strap is shown in FIG. 2. It consists of a narrow carrier part 17, which is preferably made of synthetic material and can snap into the T-shaped grooves 10 by means of corresponding snapping noses on its lower side. On its upper side it carries as guide means a ridge 18. This embodiment has, like the preceding embodiment, the advantage that the relative distances of the transverse carrier parts 17 can be arbitrarily determined in accordance with the width of the subassemblies to be used when mounting an accommodation device for a given purpose.

FIG. 3 shows a transverse carrier 11, which has in known manner as guide means a groove so that a circuit board can be passed into it with its edge. This transverse carrier 11 with groove can also snap with the aid of corresponding snapping means into the T-shaped grooves 10 of the bars 3 and 4.

The shielded housing 5 for the circuit board 6 is formed from sheet metal. The front plate or housing 5 is secured to a rectangularly shape metal sheet which is larger than the shielded housing so that it projects both above and below the outer dimensions of the shielded housing. With these projecting sections of the front metal plate, the latter is screwed to the front side of the bars 2 and 3, respectively, in threaded rails or sliding nuts held in T-shaped grooves.

The distance between the upper bars 1 and 2 and the lower bars 3 and 4 is proportioned so that circuit boards of a given size, for example so-called European standard size printed circuit boards, can be inserted if guide means such as transverse carriers 11 with grooves are secured to the bars in the usual manner. Without modification of the relative distance of the bars, the use of circuit boards of the same size in the shielded housing is possible if the guide means described above taking the form of a ridge 14 are utilized. The shielded housing 5 is provided with grooves on opposite outer sides. The latter consist, as in the embodiment of FIG. 1, of parallel depressions 7 and protrusions 8, between which the ridge 14 is guided. For guiding the circuit board plate 6 in the shielded housing 5, parallel depressions 7 and protursions 8 are also provided on opposite inner sides. Such depressions protrusions can be formed with high accuracy rapidly and at low cost in the sheet metal by means of numerically controlled stamping and nibbling machines. The position of the grooves formed by the depressions and protrusions can therefore be varied arbitrarily in dependence upon the assembling of the circuit boards for each respective shielded housing separately without special need of tools.

Due to the arrangement of outwardly directed protrusions and inwardly directed depressions for guiding the shielded housing and the circuit board in the shielded housing, the difference of the edge dimensions between the unshielded circuit board and the shielded housing with circuit board is extremely small.

A further advantage consists in that in the same accommodation device transverse carriers of conventional kind with grooves and transverse carriers with ridges can be combined so that in the same accommodation device both circuit boards in closed shielded housings and unshielded circuit boards of the same size can be used.

What is claimed is:

1. A framework for mounting circuit boards of a predetermined size which are housed in shielded housings whose walls include grooves and said framework for also mounting circuit boards of said predetermined size which are outside shielded housings, said framework having ridges which serve as guide means for insertion into said grooves in said shielded housings, said framework having carriers with grooves which serve as support means for said circuit boards which are outside shielded housings.

2. A framework as claimed in claim 1, wherein each said ridge is part of a sheet metal support for a shielded housing secured to said framework, part of said sheet metal being bent at a right angle to form said ridge.

3. A framework as claimed in claim 1, wherein each ridge is part of an elongate piece of synthetic material secured to said framework.

* * * * *